(12) United States Patent
Yu

(10) Patent No.: US 6,380,590 B1
(45) Date of Patent: Apr. 30, 2002

(54) SOI CHIP HAVING MULTIPLE THRESHOLD VOLTAGE MOSFETS BY USING MULTIPLE CHANNEL MATERIALS AND METHOD OF FABRICATING SAME

(75) Inventor: Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/792,139

(22) Filed: Feb. 22, 2001

(51) Int. Cl.[7] .......................... H01L 27/01; H01L 29/76; H01L 29/94; H01L 31/062; H01L 31/113
(52) U.S. Cl. .......................... 257/350; 257/289; 257/392
(58) Field of Search .................................. 257/347, 350, 257/289, 392

(56) References Cited

U.S. PATENT DOCUMENTS

| | | |
|---|---|---|
| 5,234,535 A | 8/1993 | Beyer et al. |
| 5,461,243 A | 10/1995 | Ek et al. |
| 5,461,250 A | 10/1995 | Burghartz et al. |
| 5,683,934 A | 11/1997 | Candelaria |
| 5,753,541 A * | 5/1998 | Shimizu ..................... 438/161 |
| 5,847,419 A | 12/1998 | Imai et al. |
| 5,906,951 A | 5/1999 | Chu et al. |
| 5,963,817 A | 10/1999 | Chu et al. |
| 5,998,807 A | 12/1999 | Lustig et al. |
| 6,059,895 A | 5/2000 | Chu et al. |
| 6,337,285 B1 * | 1/2002 | Ko ............................. 438/714 |
| 6,339,013 B1 * | 1/2002 | Naseem et al. ............. 438/491 |

* cited by examiner

Primary Examiner—Ngân V. Ngô
(74) Attorney, Agent, or Firm—Renner, Otto, Boisselle & Sklar, LLP

(57) ABSTRACT

A semiconductor-on-insulator (SOI) chip. The SOI chip includes a substrate; a buried oxide (BOX) layer disposed on the substrate; an active layer disposed on the BOX layer, the active layer having a first area made from silicon and a second area made from silicon-germanium; a first device fabricated in the first area of the active layer and having a silicon channel and a first threshold voltage; and a second device fabricated in the second area of the active layer and having a silicon-germanium channel and a second threshold voltage differing from the first threshold voltage. Also discussed are alternative forms of the SOI chip and methods of making the SOI chip.

3 Claims, 2 Drawing Sheets

US 6,380,590 B1

SOI CHIP HAVING MULTIPLE THRESHOLD VOLTAGE MOSFETS BY USING MULTIPLE CHANNEL MATERIALS AND METHOD OF FABRICATING SAME

TECHNICAL FIELD

The present invention generally relates to semiconductor-on-insulator (SOI) integrated circuits and, more particularly, to an SOI chip having an active layer with areas made from different materials to support the fabrication of multiple threshold voltage MOSFETs and a method of making the SOI chip.

BACKGROUND ART

Traditional semiconductor-on-insulator (SOI) integrated circuits typically have a silicon substrate having a buried oxide (BOX) layer disposed thereon. A silicon active layer is disposed on the BOX layer. Within the active layer, active devices, such as transistors, are formed in active regions. The size and placement of the active regions are defined by isolation regions. As a result of this arrangement, the active devices are isolated from the substrate by the BOX layer. More specifically, a body region of each SOI transistor does not have body contacts and is therefore "floating."

SOI chips offer potential advantages over bulk chips for the fabrication of high performance integrated circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased.

However, there exists a need in the art to fabricate devices having differing electrical characteristics on a single SOI chip.

SUMMARY OF THE INVENTION

According to one aspect of the invention, the invention is a semiconductor-on-insulator (SOI) chip. The SOI chip includes a substrate; a buried oxide (BOX) layer disposed on the substrate; an active layer disposed on the BOX layer, the active layer having a first area made from silicon and a second area made from silicon-germanium; a first device fabricated in the first area of the active layer and having a silicon channel and a first threshold voltage; and a second device fabricated in the second area of the active layer and having a silicon-germanium channel and a second threshold voltage differing from the first threshold voltage.

According to another aspect of the invention the invention is a semiconductor-on-insulator (SOI) chip. The SOI chip includes a substrate; a buried oxide (BOX) layer disposed on the substrate; an active layer disposed on the BOX layer, the active layer having a first area made from silicon-germanium, the first area of silicon-germanium having a first atomic concentration of silicon and a first atomic concentration of germanium, and a second area made from silicon-germanium, the second area of silicon-germanium having a second atomic concentration of silicon differing from the first atomic concentration of silicon and a second atomic concentration of germanium differing from the first atomic concentration of germanium; a first device fabricated in the first area of the active layer and having a silicon-germanium channel and a first threshold voltage; and a second device fabricated in the second area of the active layer and having a silicon-germanium channel and a second threshold voltage differing from the first threshold voltage.

According to yet another aspect of the invention, the invention is a method of fabricating a semiconductor-on-insulator (SOI) chip comprising the steps of: providing a wafer of SOI material, the wafer of SOI material having a silicon layer disposed on a buried oxide (BOX) layer, the BOX layer disposed on a substrate; implanting germanium into a portion of the silicon layer to form an active layer having a first area made from silicon and a second area made from silicon-germanium; forming a first device in the first area of the active layer, the first device having a silicon channel and a first threshold voltage; and forming a second device in the second area of the active layer, the second device having a silicon-germanium channel and a second threshold voltage differing from the first threshold voltage.

BRIEF DESCRIPTION OF DRAWINGS

These and further features of the present invention will be apparent with reference to the following description and drawings, wherein.

DISCLOSURE OF INVENTION

Figure 1:
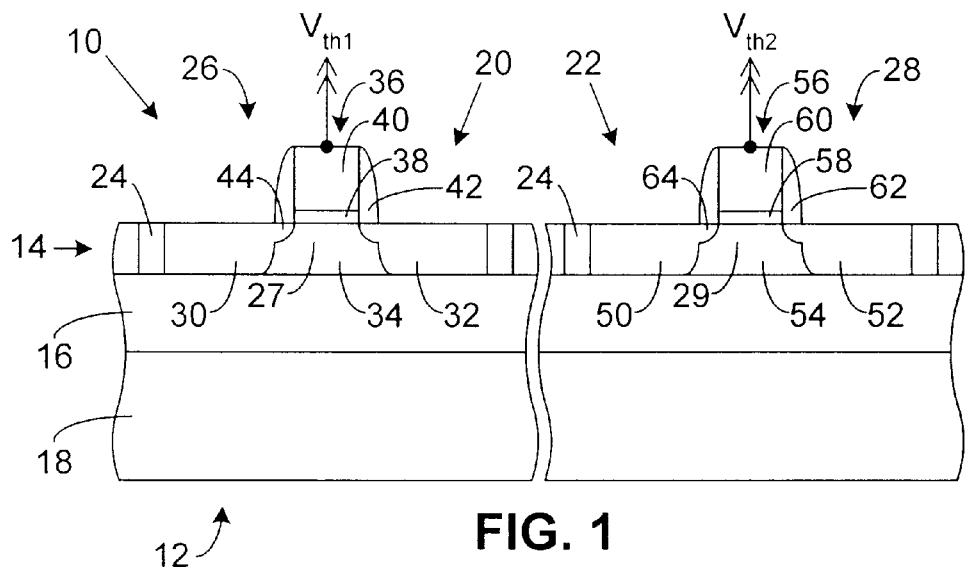
FIG. 1 is a cross-section of a semiconductor-on-insulator (SOI) chip having an active layer to support the fabrication of devices with differing electrical characteristics.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring to FIG. 1, an exemplary semiconductor-on-insulator (SOI) chip 10 is illustrated. The SOI chip is fabricated from an SOI wafer 12 which has an active layer 14 disposed on a buried oxide (BOX) layer 16. The BOX layer 16 is disposed, in turn, on a silicon substrate 18. A method of fabricating the SOI chip 10 is described in more detail below.

The SOI chip 10 is divided into two or more areas. The material of the active layer 14 differs among the divided areas of the SOI chip 10. In the illustrated embodiment, the SOI chip 10 has a first area 20 where the active layer 14 is silicon (Si) and a second area 22 where the active layer 14 is silicon-germanium (SiGe). In one embodiment, the silicon-germanium of the second area 22 has an atomic concentration of silicon of about 20% to about 90% and an atomic concentration of silicon-germanium of about 10% to about 80%. In another embodiment, the second area 22 has an atomic concentration of silicon of about 40% to about 80% and an atomic concentration of silicon-germanium of about 20% to about 60%. It is noted that alternative semiconductor materials can be used for the active layer 14 in various areas of the SOI chip as deemed appropriate by the designer. In addition, more than the two illustrated areas can be fabricated on one SOI chip 10 where each area can have a different semiconductor material in the active layer 14. Alternatively, more than one area can have the same semiconductor material in the active layer 14, but other areas have a different semiconductor material. In another embodiment, the SOI chip 10 can be fabricated with one or more areas where the active layer 14 is made from silicon-germanium (or other semiconductor material) but. with different atomic concentrations for the silicon and the germanium (e.g., one area with an atomic concentration of silicon of about 40% and an atomic concentration of germanium of about 60% and another area with an atomic concentration of silicon of about 35% and an atomic concentration of germanium of about 65%).

Within the active layer 14, isolation regions 24, such as shallow trench isolation (STI) regions, define the placement of active regions used for the fabrication of active devices, such as the illustrated partially-depleted metal oxide semiconductor field effect transistors (MOSFETs). The fabrication of active devices, using the active layer 14 is well known in the art and will not be described in great detail. In addition, hundreds, thousands or even millions of interconnected active devices may be formed on the chip 10. The devices can also include other circuit elements such as other types of transistors, diodes, resistors, capacitors and the like.

In the illustrated embodiment, a device 26 having a silicon channel 27 is shown in the first area 20 and a device 28 having a silicon-germanium channel 29 is shown in the second area 22. Within the active layer 14 of the first area 20, the device 26 has a source 30 and a drain 32 with a body region 34 disposed therebetween, each being formed from the silicon of the first area 20 of the active layer 14. Disposed on top of the body 34 is a gate 36. The gate 36 has a gate oxide layer 38 disposed on the body 34 and a gate electrode portion 40 disposed on the gate oxide layer 38. The gate electrode portion 40 can be, for example, silicon, polysilicon, polysilicon-germanium, tungsten (W), molybdenum (Mo) or a conductive refractory material as are known in the art. Alternative gate stack arrangements, as are known in the art, and can also be used for the device 26. Additionally, sidewall spacers 42 are disposed adjacent the gate 36.

The source 30 and the drain 32 are doped appropriately for the formation of N-type or P-type source 30 and drain 32 areas. More specifically, during fabrication of the device 26 and before the spacers 42 are formed, the source 30 and drain 32 are doped to form extensions 44. The extensions 44 can have a dopant concentration of about $1.0 \times 10^{19}$ atoms/$cm^3$ to about $1.0 \times 10^{20}$ atoms/$cm^3$. Following spacer 42 formation, the source 30 and drain 32 are doped again with deep implants. The deep implants can have a dopant concentration of about $1.0 \times 10^{20}$ atoms/$cm^3$ to about $1.0 \times 10^{21}$ atoms/$cm^3$.

Within the active layer 14 of the second area 22, the device 28 has a source 50 and a drain 52 with a body region 54 disposed therebetween, each being formed from the silicon-germanium of the second area 22 of the active layer 14. Disposed on top of the body 54 is a gate 56. The gate 56 has a gate oxide layer 58 disposed on the body 54 and a gate electrode portion 60 disposed on the gate oxide layer 58. The gate electrode portion 60 can be, for example, silicon, polysilicon, polysilicon-germanium, tungsten (W), molybdenum (Mo) or a conductive refractory material as are known in the art. In the illustrated embodiment, the gate electrode portion 60 of the device 28 is made from the same material as the gate electrode portion 40 of the device 26. In an alternative arrangement, the gate electrode portions 40 and 60 can be made from different materials. Alternative gate stack arrangements, as are known in the art, and can also be used for the device 28. Additionally, sidewall spacers 62 are disposed adjacent the gate 56.

The source 50 and drain 52 are doped appropriately for the formation of N-type or P-type source 50 and drain 52 areas. More specifically, during fabrication of the device 28 and before the spacers 62 are formed, the source 50 and drain 52 are doped to form extensions 64. The extensions 64 can have a dopant concentration of about $1.0 \times 10^{19}$ atoms/$cm^3$ to about $1.0 \times 10^{20}$ atoms/$cm^3$. Following spacer 62 formation, the source 50 and drain 52 are doped again with deep implants. The deep implants can have a dopant concentration of about $1.0 \times 10^{20}$ atoms/$cm^3$ to about $1.0 \times 10^{21}$ atoms/$cm^3$.

It is noted that in the illustrated embodiment the active layer 14 in both the first area 20 and the second area 22 is not initially doped before formation of the foregoing device components. As a result, the channels 27 and 29 of the devices 26 and 28 are undoped channels. However, in an alternative embodiment, before formation of any of the foregoing components for the devices 26 and 28, the active layer 14 or portions of the active layer 14 can be initially doped for the establishment of N-channel or P-channel devices.

As a result of the different materials of the active layer 14 in the first area 20 and the second area 22, the device 26 and the device 28 have different structures which exhibit different electrical characteristics. More specifically, the device 26 has a silicon channel 27 and the device 28 has a silicon-germanium channel 29. Therefore, each device 26 and 28 has a different gate-to-substrate work function such that a threshold voltage (or first threshold voltage, $V_{th1}$) for the device 26 differs from a threshold voltage (or second threshold, $V_{th2}$) for the device 28. In most cases, $V_{th2}$ will be lower than $V_{th1}$. For a typical silicon channel device, such as the device 26, $V_{th1}$ is about 250 millivolts to about 350 millivolts. For a typical silicon-germanium channel device, such as the device 28, $V_{th2}$ is about 100 millivolts to about 250 millivolts. However, one skilled in the art will recognize that a number of factors will contribute to the actual threshold voltage of any particular device. These factors include, for example, respective silicon and germanium concentration for devices with germanium present in the gate, body/channel thickness and doping, gate electrode properties, and the like.

Figure 2:
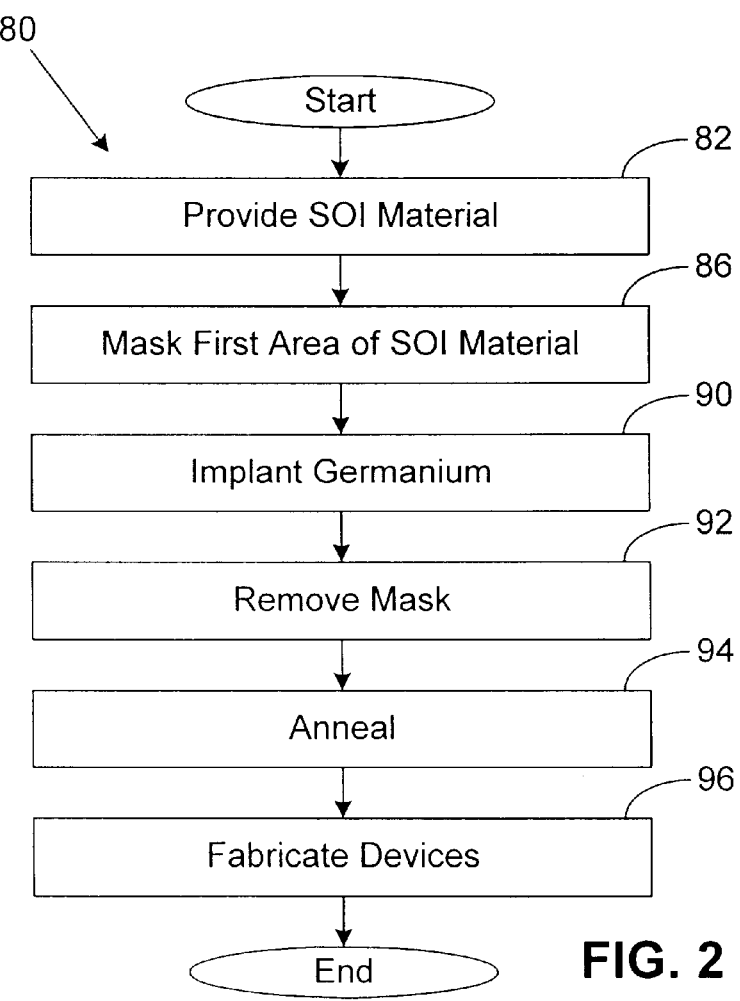
FIG. 2 is a flowchart of a method for fabricating the SOI chip.
Figure 3A:
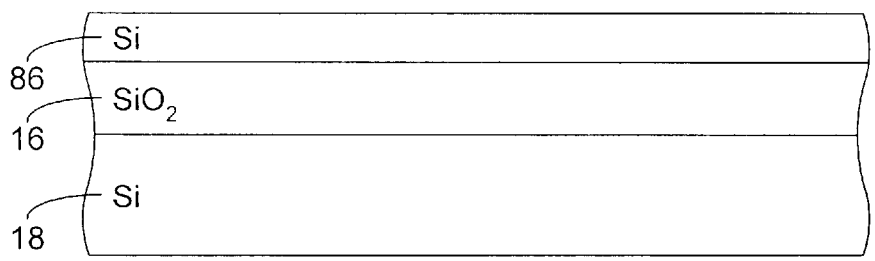
FIGS. 3A through 3D are cross-sections of the SOI chip in various stages of manufacture.

Referring now to FIG. 2, a method 80 of fabricating the wafer 12 from which the SOI chip 10 is made is illustrated in flowchart format. With additional reference to FIG. 3A, the method 80 begins in step 82 where a wafer of SOI material 84 is provided. The wafer of SOI material 84 has a silicon layer 86 disposed on an isolation layer made from a material such as silicon oxide. One skilled in the art will recognize that the isolation layer is the same as the BOX layer 16 illustrated in FIG. 1 and, therefore, will be referred to as the BOX layer 16. The BOX layer 16 is disposed on a substrate. More particularly, the substrate is the silicon substrate 18. The wafer of SOI material 84 can be made from a number of known techniques, such as wafer bonding or a separated-by-implanted oxygen (SIMOX) technique.

Figure 3B:
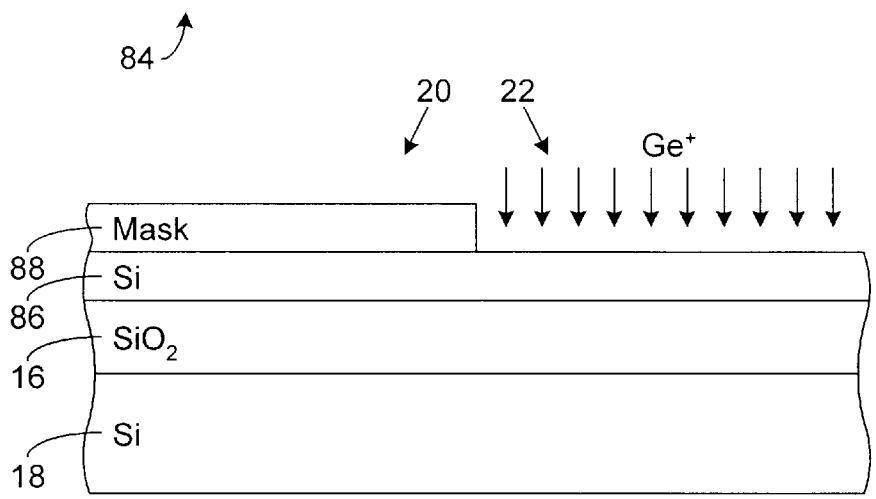

Next, in step 88 and as illustrated in FIG. 3B, a mask 88 is deposited or grown on the silicon layer 86 and then patterned such that the second area 22 is left exposed and the first area 20 remains masked. The mask 88 material is selected to prevent or minimize the implantation of germanium ions into the silicon layer 86 in the first area 20. For example, the mask 88 can be a photoresist or an oxide.

After the mask 88 has been formed, germanium ions are selectively implanted into the second area 22 of the silicon layer 86 in step 90. The germanium is implanted with an energy of about 10 keV to about 50 keV and a dose of about $1 \times 10^{16}$ atoms/$cm^2$ to about $1 \times 10^{17}$ atoms/$cm^2$.

Figure 3C:
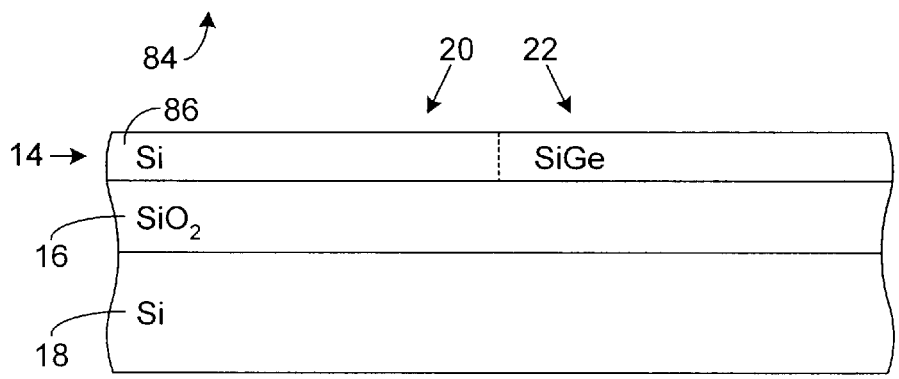

Next, in step 92 and as illustrated in FIG. 3C, the mask 88 is removed. The wafer of SOI material 84 is then annealed in step 94 to recrystalize the silicon layer 86, particularly in the second area 22 where germanium was implanted in step 90. The anneal cycle is conducted a temperature of about 1000° C. to about 1100° C. for about 0.1 seconds to about 10 seconds.

Figure 3D:
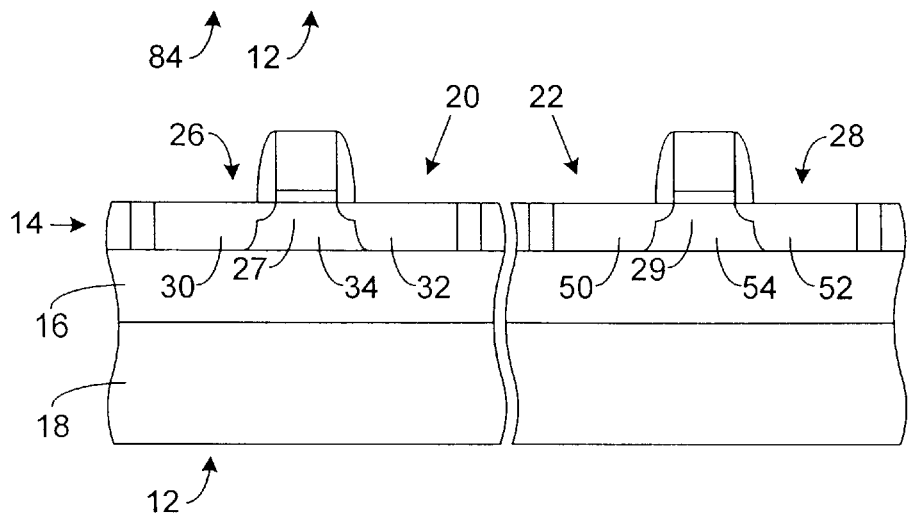

At this point, the silicon layer 86 has been made into the active 14 described above where the first area 20 is silicon and the second area 22 is silicon-germanium. The wafer of SOI material 84 is now configured as the wafer 12 and can be used to fabricate devices in step 96. As illustrated in FIG. 3D, the wafer 12 can be used to fabricate the device 26 in the first area 20 and the device 28 in the second area 22. The active layer 14 where the device 26 is fabricated is silicon resulting in the device 26 having a silicon source 30, drain 32 and body 34/channel 27. As indicated above, the device 26 will have a first threshold voltage, or $V_{th1}$. It is noted that selected portions of the device 26 can be implanted with ions, such as germanium, to achieve various desired effects. For example, the source 30 and the drain 32 could be implanted with germanium to form an abrupt source/body junction and/or an abrupt drain/body junction.

The active layer 14 where the device 28 is fabricated is silicon-germanium resulting in the device 28 having a silicon-germanium source 50, drain 52 and body 54/channel 29. As indicated above, the device 28 will have a second threshold voltage, or $V_{th2}$, differing from the first threshold voltage of the device 26. As with the device 26, selected portions of the device 28 can also be implanted to achieve various desired effects.

Although particular embodiments of the invention have been described in detail, it is understood that the invention is not limited correspondingly in scope, but includes all changes, modifications and equivalents coming within the spirit and terms of the claims appended hereto.

For example, the method 80 could be modified to fabricate the wafer 12 using alternative techniques. In one such modified method, the wafer of SOI material 84 is masked and the exposed portion of the silicon layer 86 is etched. It is noted that a thin layer of silicon (e.g., about 100 Å to about 200 Å) could be left on the BOX layer 16 after etching. Next, silicon-germanium is grown in the etched area of the silicon layer 86 using selective or non selective epitaxy. Devices are then fabricated using the resulting wafer.

In another modification, a thin layer of silicon (e.g., about 100 Å to about 200 Å) can be formed on top of the silicon-germanium portion of the active layer 14. The thin layer of silicon can be formed using selective or nonselective epitaxy. The thin layer of silicon can be used to assist in the formation of the gate oxide for devices in the second area 22.

What is claimed is:

1. A semiconductor-on-insulator (SOI) chip comprising;
   a substrate;
   a buried oxide (BOX) layer disposed on the substrate;
   an active layer disposed on the BOX layer, the active layer having a first area made from silicon and a second area made from silicon-germanium;
   a first device fabricated in the first area of the active layer and having a silicon channel and a first threshold voltage; and
   a second device fabricated in the second area of the active layer and having a silicon-germanium channel and a second threshold voltage differing from the first threshold voltage.

2. The SOI chip according to claim wherein the silicon-germanium of the second area of the active layer has an atomic concentration of silicon of about 20% to about 90% and an atomic concentration of germanium of about 10% to about 80%.

3. A semiconductor-on-insulator (SOI) chip comprising;
   a substrate;
   a buried oxide (BOX) layer disposed on the substrate;
   an active layer disposed on the BOX layer, the active layer having a first area made from silicon-germanium, the first area of silicon-germanium having a first atomic concentration of silicon and a first atomic concentration of germanium, and a second area made from silicon-germanium, the second area of silicon-germanium having a second atomic concentration of silicon differing from the first atomic concentration of silicon and a second atomic concentration of germanium differing from the first atomic concentration of germanium;
   a first device fabricated in the first area of the active layer and having a silicon-germanium channel and a first threshold voltage; and
   a second device fabricated in the second area of the active layer and having a silicon-germanium channel and a second threshold voltage differing from the first threshold voltage.

* * * * *

UNITED STATES PATENT AND TRADEMARK OFFICE
CERTIFICATE OF CORRECTION

PATENT NO.     : 6,380,590 B1
DATED          : April 30, 2002
INVENTOR(S)    : Yu It is certified that error appears in the above-identified patent and that said Letters Patent is hereby corrected as shown below:

Column 6,
Line 21, replace "according to claim wherein" with -- according to claim 1, wherein --.

Signed and Sealed this

Eighteenth Day of June, 2002

*Attest:*

*Attesting Officer*

JAMES E. ROGAN
*Director of the United States Patent and Trademark Office*